United States Patent [19]

Schütt

[11] Patent Number: 5,406,458
[45] Date of Patent: Apr. 11, 1995

[54] PRINTED CIRCUIT BOARD HAVING TAPERED CONTACT PADS FOR SURFACE MOUNTED ELECTRICAL COMPONENTS

[75] Inventor: Joachim Schütt, Neusäss, Germany

[73] Assignee: NCR Corporation, Dayton, Ohio

[21] Appl. No.: 164,977

[22] Filed: Dec. 10, 1993

[30] Foreign Application Priority Data

Mar. 11, 1993 [GB] United Kingdom ................. 9304967

[51] Int. Cl.[6] ............................................. H05K 7/10
[52] U.S. Cl. ..................... 361/767; 361/760; 361/808; 174/261; 174/263; 257/779; 439/68; 439/83
[58] Field of Search ................. 29/832, 840, 854, 857, 29/860; 174/260, 261; 228/180.21, 180.22, 180.1, 179.1; 257/700, 778, 779; 361/760, 763, 767, 768, 771, 773, 774, 777, 779, 782, 807, 808, 809, 811; 437/209; 439/68, 69, 71, 83

[56] References Cited

U.S. PATENT DOCUMENTS

| | | | |
|---|---|---|---|
| 4,164,778 | 8/1979 | Sawairi et al. | 361/779 |
| 4,870,225 | 9/1989 | Anao et al. | 228/180.21 |
| 5,303,122 | 4/1994 | Adams, Jr. et al. | 361/767 |
| 5,311,405 | 5/1994 | Tribbey et al. | 361/767 |

FOREIGN PATENT DOCUMENTS

| | | | |
|---|---|---|---|
| 1-276790 | 11/1989 | Japan | 439/83 |
| 4-176191 | 6/1992 | Japan | 29/840 |

Primary Examiner—Leo P. Picard
Assistant Examiner—Donald A. Sparks
Attorney, Agent, or Firm—Albert L. Sessler, Jr.

[57] ABSTRACT

A printed circuit board (23) having a plurality of solder coated contact pads (24, 26) for the surface mounting of electrical components (10[1]) thereon. Each pad (24, 26) has a rectangular portion and a triangular portion extending in the direction of the component's body (18) so as to reduce the amount of solder (28) located under the body (18) while not disadvantageously affecting the tolerance with which connector caps (20, 22) of the components (10[1]) can be mounted on, and bonded to, the pads (24, 26). This arrangement inhibits the formation of solder droplets on the printed circuit board (23) during the bonding process. At least one of the components fixed to the connector pads has an elongated electrically insulating body portion provided at its ends with connector portions which are respectively bonded to the connector pads. The dimension of the rectangular portion of each pad which is at right angles to the longitudinal axis of the associated component is less than the transverse dimension of the associated connector portion of the associated component. The connector portions of the electrical component extend over and are soldered to parts of both the rectangular and the triangular portions of each of the pads.

2 Claims, 2 Drawing Sheets

PRINTED CIRCUIT BOARD HAVING TAPERED CONTACT PADS FOR SURFACE MOUNTED ELECTRICAL COMPONENTS

BACKGROUND OF THE INVENTION

The present invention relates to a printed circuit board for surface mounted electrical components.

Known printed circuit boards (PCBs) for surface mounted electrical components include a plurality of rectangular contact pads provided on the surface upon which the components are to be mounted. The pads are coated with solder paste and the components are bonded to the pads by way of electrical connector portions.

The components commonly comprise an elongate, electrically insulating, e.g. ceramic, body portion in the form of a rectangular bar or cylinder, having electrical connectors such as connector caps at each end. Once the components are mounted on the paste covered pads, the whole structure is heated and the solder paste melts in a so-called "reflow" process. Upon solidification, the solder bonds the electrical connectors to the pads so as to provide the required mechanical and electrical connection between the components and the PCB.

With such known PCBs, each component's body portion may overlie and contact substantial portions of the solder coated pads. During the reflow process, when the solder paste is melting, the solder contacting the electrically insulating body portion may separate from the pads and form one or more solder droplets which solidify at the side of the body of the component. The droplets are separate from the pads and connectors and so do not contribute to the connection of the component to the PCB. If the droplets are not removed from the PCB, they can become dislodged from their position next to the components and can cause short circuits at other locations on the PCB. It has been determined that solder droplets can form adjacent to most of the components on the PCB.

Although it is known to remove the droplets by washing the PCB with a chemical solution, the use of such chemicals is becoming increasingly prohibited, and, moreover, the washing of the PCB represents an additional stage which disadvantageously increases the cost and time involved in mounting the components on the PCB.

SUMMARY OF THE INVENTION

According to the present invention, there is provided a printed circuit board having a plurality of pairs of connector pads for a respective plurality of surface mounted electrical components, each of said pads having a solder paste portion thereon, characterized in that each of said solder paste portions has a rectangular portion and a triangular portion, and the triangular portions on each pair of pads extend towards each other. At least one of the components fixed to the connector pads has an elongated electrically insulating body portion provided at its ends with connector portions which are respectively bonded to the connector pads. The dimension of the rectangular portion of each pad which is at right angles to the longitudinal axis of the associated component is less than the transverse dimension of the associated connector portion of the associated component. The connector portions of the electrical component extend over and are soldered to parts of both the rectangular and the triangular portions of each of the pads.

It has been found that the tapered shape of the solder paste portion greatly reduces the likelihood of solder droplets forming.

Advantageously, the contact pads have the same shape as the solder paste portions.

It is accordingly an object of the present invention to provide a PCB for surface mounted electrical components which inhibits the formation of solder droplets and so reduces the risk of short circuits occurring especially in a "no clean" process when the circuit board is not washed.

Additional benefits and advantages of the present invention will become apparent to those skilled in the art to which this invention relates from the subsequent description of the preferred embodiment and the appended claims, taken in conjunction with the accompanying drawings.

DETAILED DESCRIPTION

Figure 1:
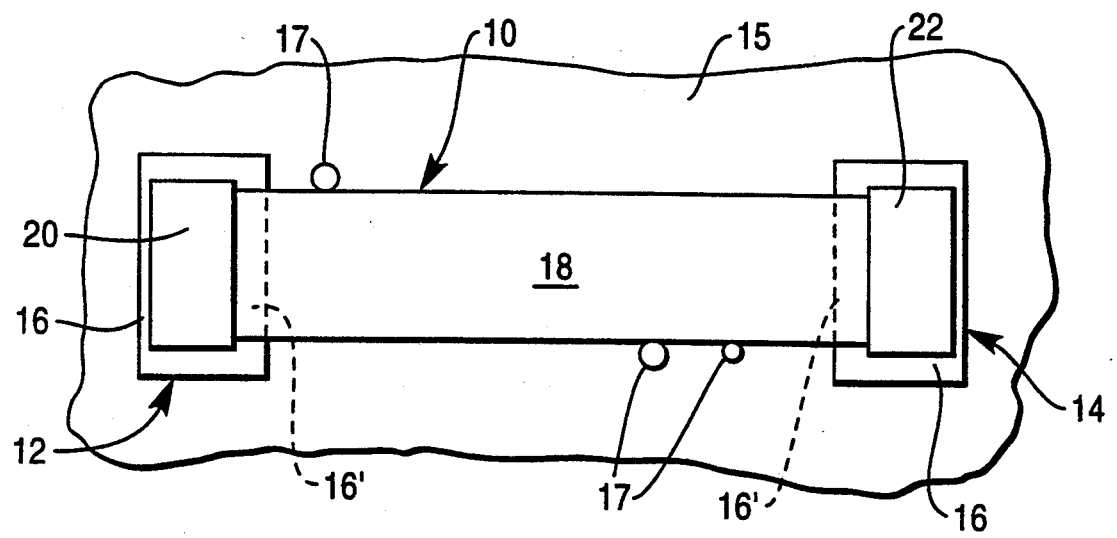
FIG. 1 is a plan view of a surface mounted device mounted on pads of a known PCB.
Figure 2:
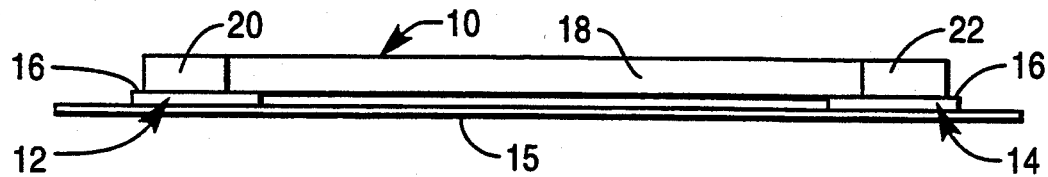
FIG. 2 is a side elevational view of the mounted device of FIG. 1.

FIGS. 1 and 2 show an elongate surface mounted electrical component 10 such as a resistor or capacitor positioned on a pair of contact pads 12, 14 of a PCB 15. Each pad 12, 14 is coated with a similarly shaped portion 16 of solder paste.

The component 10 comprises an elongate rectangular body portion 18 formed of ceramic or plastic material and has electrical connector caps 20, 22 at opposite ends thereof, the component 10 being mounted so that the connector caps overlie the pads 12, 14 respectively within known tolerance values. As can be seen from FIG. 1, a portion $16^1$ of the solder paste 16 on each pad 12, 14 extends under the body portion 18 of the component 10 and it is these portions $16^1$ that lead to the problems associated with known PCBs. During reflow, the melted solder portions $16^1$ may separate from the main solder body 16 and may form one or more droplets 17 along the side of the body 18. Subsequently, such solder droplets 17 may become dislodged from their location next to the component's body portion 18 and can form short circuits at other locations on the PCB 15.

Figure 3:
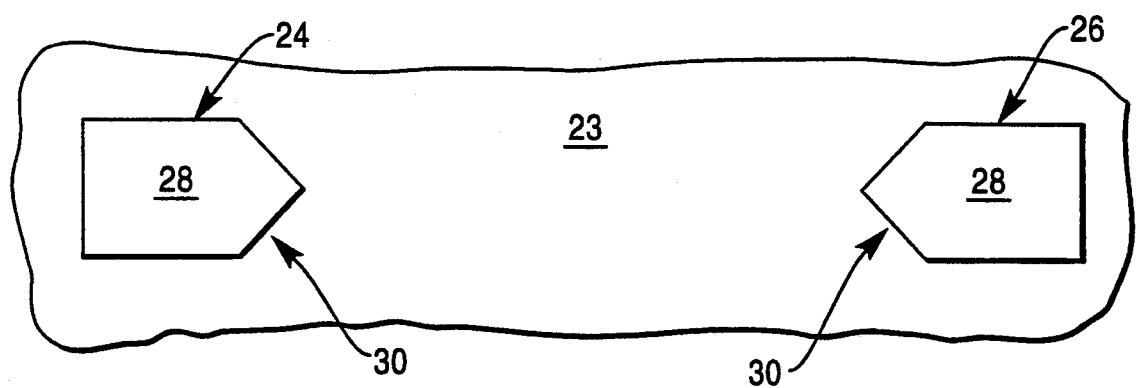
FIG. 3 is a plan view of a pair of pads of a PCB embodying the present invention.
Figure 4:
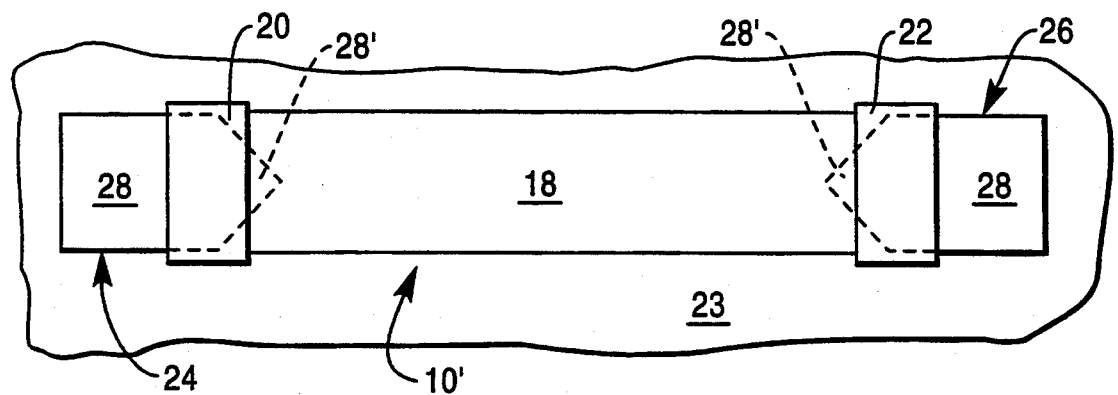
FIG. 4 is a plan view of a surface mounted device located on the pads of FIG. 3.

FIGS. 3 and 4 show a PCB 23 and pads 24, 26 according to an embodiment of the present invention. In FIG. 3, the pads 24, 26 have similarly shaped solder paste portions 28 provided thereon, and are shown without an electrical component mounted thereon. In FIG. 4, an electrical component $10^1$ is shown mounted on the PCB 23; for the sake of convenience the same reference numerals are used for the parts of the components $10^1$ as are used for the component 10.

As can clearly be seen in FIGS. 3 and 4, the paste 28 and pads 24, 26 are the same shape and have tapered portions 30 extending towards one another and thus in a direction away from the connector caps 20, 22 and towards the body portion 18 of the component $10^1$. In the illustrated example, each tapered portion 30 corresponds to the area bounded by an isosceles triangle, the two equal sides forming the tapered portion 30 and preferably meeting at an angle of 90 degrees.

Preferably, that dimension of each paste portion 28 and pad 24, 26 which is at right angles to the longitudinal axis of the associated component $10^1$ is less than or equal to the transverse dimension of the end caps 20, 22 of the component $10^1$, as seen in FIG. 4. As can also be seen in FIG. 4, only a small amount of solder paste $28^1$ extends under the body 18 of the component $10^1$ and this greatly reduces the occurrence of solder droplets. However, the shape of the tapered portions 30 of the pads, which increases in width in a direction away from the body portion 18 of the component $10^1$, provides an adequate amount of solder paste to allow for the positioning of the component 10 on the pads 24, 26 with a tolerance at least as good as that for known PCBs. Although only one pair of connector pads 24, 26 and one component $10^1$ are shown in FIGS. 3 and 4, it should be understood that a plurality of pairs of connector pads 24, 26 are provided on the PCB 23 with a plurality of electrical components being respectively bonded to the pair of pads 24, 26 as described above. Also, it should be noted that the tapered paste portion of the present invention could be provided on a contact pad of any desired shape, including a rectangular shape.

Thus, a PCB according to the present invention allows for the surface mounting of electrical components with a greatly reduced risk of solder drops being formed, and so a subsequent costly and time consuming washing stage is not required.

Although the invention has been described with particular reference to a preferred embodiment thereof, variations and modifications of the present invention can be effected within the spirit and scope of the following claims.

What is claimed is:

1. A printed circuit board assembly for soldered surface mounted electrical components which reduces the occurrence of solder droplets during assembly, comprising:

a printed circuit board;

at least one pair of connector pads fixed to the printed circuit board, each said connector pad having a rectangular portion and a triangular portion contiguous thereto with the triangular portions extending toward each other;

a solder paste portion on each of said pads and having the same dimensions and configuration as its respective pad; and a surface mounted electrical component fixed to each pair of pads by said solder paste portions;

the electrical component fixed to the connector pads having an elongated electrically insulating body portion provided at its ends with connector portions which are respectively bonded to the connector pads;

the dimension of the rectangular portion of each pad which is at right angles to the longitudinal axis of the associated component being less than the transverse dimension of the associated connector portion of the associated component.

2. The printed circuit board assembly of claim 1, in which the connector portions of the electrical component extend over and are soldered to parts of both the rectangular and the triangular portions of each of said pads.

* * * * *